(12) United States Patent
Hung et al.

(10) Patent No.: US 11,869,943 B2
(45) Date of Patent: Jan. 9, 2024

(54) SILICON CARBIDE SEMICONDUCTOR DEVICE

(71) Applicant: Shanghai Hestia Power Inc., Shanghai (CN)

(72) Inventors: Chien-Chung Hung, Hsinchu (TW); Kuo-Ting Chu, Hsinchu (TW); Chwan-Yin Li, Hsinchu (TW)

(73) Assignee: SHANGHAI HESTIA POWER INC., Shanghai (CN)

( * ) Notice: Subject to any disclaimer, the term of this patent is extended or adjusted under 35 U.S.C. 154(b) by 419 days.

(21) Appl. No.: 17/118,964

(22) Filed: Dec. 11, 2020

(65) Prior Publication Data

US 2022/0190117 A1    Jun. 16, 2022

(51) Int. Cl.
*H01L 29/16* (2006.01)
*H01L 29/872* (2006.01)
*H01L 29/06* (2006.01)

(52) U.S. Cl.
CPC ...... *H01L 29/1608* (2013.01); *H01L 29/0619* (2013.01); *H01L 29/872* (2013.01); *H01L 29/8725* (2013.01)

(58) Field of Classification Search
CPC ............. H01L 29/1608; H01L 29/0619; H01L 29/872; H01L 29/8725; H01L 29/66068; H01L 29/0623; H01L 29/0692; H01L 29/0878; H01L 29/7806; H01L 29/7813
See application file for complete search history.

(56) References Cited

U.S. PATENT DOCUMENTS

| | | | |
|---|---|---|---|
| 9,209,293 B2 | 12/2015 | Hung et al. | |
| 9,246,016 B1 | 1/2016 | Yen et al. | |
| 10,418,476 B2 | 9/2019 | Yen et al. | |
| 2018/0308975 A1* | 10/2018 | Ohse | H01L 29/1608 |
| 2018/0358463 A1 | 12/2018 | Kobayashi et al. | |

* cited by examiner

*Primary Examiner* — Meiya Li
(74) *Attorney, Agent, or Firm* — MUNCY, GEISSLER, OLDS & LOWE, PC

(57) ABSTRACT

A silicon carbide semiconductor device, in particular a monolithically integrated trench Metal-Oxide-Semiconductor Field-Effect Transistor with segmentally surrounded trench Schottky diode, includes a semiconductor substrate, a trench Metal-Oxide-Semiconductor Field-Effect Transistor and a trench Schottky diode. The trench Schottky diode has a perpendicularly disposed trench extending in a first horizontal direction, a metal electrode filled into the trench, and a plurality of doped regions disposed segmentally and extending in a second horizontal direction around the trench. The first horizontal direction is substantially orthogonal to the second horizontal direction, a side wall and a bottom wall of the metal electrode in the trench forms a Schottky junction, and the current flowing from the metal electrode is restricted between adjacent doped regions.

7 Claims, 18 Drawing Sheets

SILICON CARBIDE SEMICONDUCTOR DEVICE

FIELD OF THE INVENTION

The present invention relates to a semiconductor device, and more particularly to a silicon carbide semiconductor device.

BACKGROUND OF THE INVENTION

Semiconductor power devices typically require high breakdown voltages, a small on-resistance as possible, low reverse leakage current, and fast switching speeds to reduce conduction losses and switching losses during operation. Silicon carbide (SiC) is considered to be an excellent material for power switching devices due to its wide bandgap ($E_g$=3.26 eV), high critical breakdown field strength (2.2 MV/cm) and high thermal conductivity (4.9 W/cm-K). Under the condition of the same breakdown voltage, a withstand voltage layer (a drift layer with low doping concentration) of a power device made of silicon carbide has a thickness of only one tenth of the thickness of the silicon power device, and has a theoretical on-resistance reaching several hundredths of silicon.

However, because of the wide energy gap of silicon carbide, the on state threshold voltage at which a body diode of a silicon carbide Metal-Oxide-Semiconductor Field-Effect Transistor (SiC MOSFET) is about 3V, which causes large power loss when the reverse current flows back during switching and limits the switching speed. In addition, the epitaxial basal plane dislocation generated by silicon carbide when depositing the drift layer will expand into a stacking fault due to recombination of carriers when the body diode turns on, which will lead to a failure of the SiC MOSFET. Therefore, when a semiconductor manufacturer manufactures the SiC MOSFET, one more Schottky diode connected in parallel is designed, so that the operation speed is improved, the power consumption is reduced, and the reliability problem caused by the expansion of stacking faults is avoided. Similar prior art can be found in U.S. Pat. Nos. 9,209,293, 9,246,016, 10,418,476, No. 2018/0358463, and so on.

SUMMARY OF THE INVENTION

The present invention relates to a semiconductor device, and more particularly to a silicon carbide semiconductor device.

The invention discloses a silicon carbide semiconductor device comprising a first silicon carbide semiconductor layer having a first conductivity type; a second silicon carbide semiconductor layer having the first conductivity type and disposed on the first silicon carbide semiconductor layer; a third silicon carbide semiconductor layer having a second conductivity type and disposed on an upper surface of the second silicon carbide semiconductor layer; a first semiconductor region having the first conductivity type and disposed in the third silicon carbide semiconductor layer; a first trench perpendicularly penetrating through the first semiconductor region and the third silicon carbide semiconductor layer into the second silicon carbide semiconductor layer and extending in a first horizontal direction; a second trench spaced apart from the first trench, the second trench perpendicularly penetrating through the third silicon carbide semiconductor layer into the second silicon carbide semiconductor layer and extending in the first horizontal direction; a second semiconductor region having the second conductivity type and comprising a plurality of first portions extending in a second horizontal direction and a second portion extending in the first horizontal direction and disposed in the second silicon carbide semiconductor layer under the first trench; a gate region comprising a gate insulating layer disposed in the first trench and a poly gate embedded in the first trench and formed on the gate insulating layer; and a metal electrode in contact with the first semiconductor region and the gate region and embedded in the second trench to be in electrical contact with the second semiconductor region and the third silicon carbide semiconductor layer, and a side wall and a bottom wall of the metal electrode forms a Schottky junction with the second silicon carbide semiconductor layer in the second trench, wherein the first portion of the second semiconductor region defines a plurality of pickup regions and a plurality of slice regions, the plurality of pickup regions surrounds the first trench and is connected to the second portion, the plurality of slice region surrounds the second trench and is connected to the pickup regions, the current flowing from the metal electrode is restricted between the adjacent slice regions.

The invention also provides an device of an integrated trench Metal-Oxide-Semiconductor Field-Effect Transistor (MOSFET) with segmentally surrounded trench Schottky diode, comprising a semiconductor substrate, a trench MOSFET formed on the semiconductor substrate, and a trench Schottky diode formed on the semiconductor substrate, wherein the trench Schottky diode comprises a trench perpendicularly disposed and extending in a first horizontal direction, a metal electrode filled into the trench, and a plurality of doped regions disposed segmentally and extending in a second horizontal direction around the trench, the first horizontal direction is substantially orthogonal to the second horizontal direction, a side wall and a bottom wall of the metal electrode in the trench forms a Schottky junction, and the current flows from the metal electrode is restricted between the plurality of doped regions which are adjacent.

DETAILED DESCRIPTION OF THE PREFERRED EMBODIMENTS

Figure 1A:
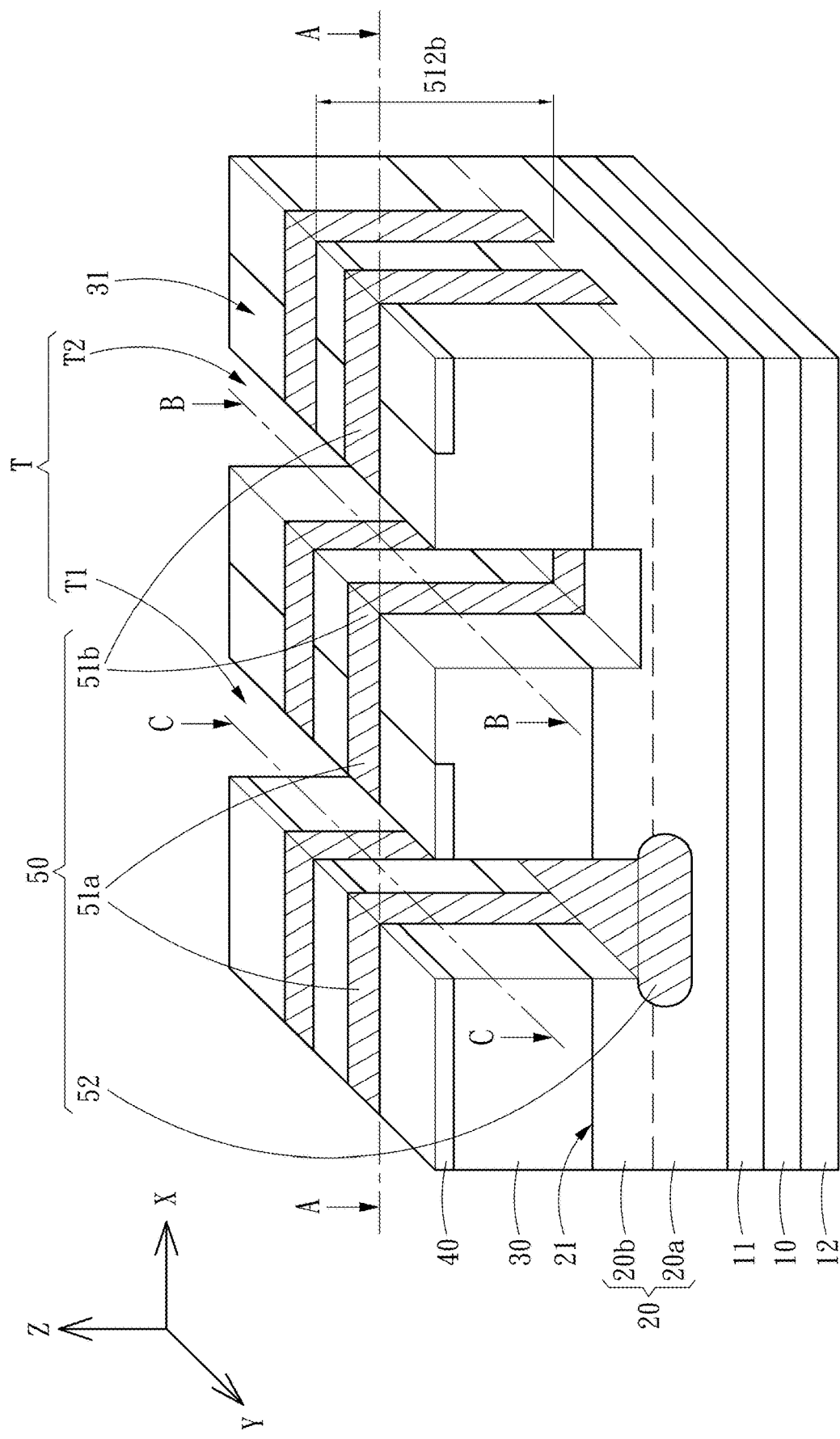
FIG. 1A and FIG. 1B are perspective structure views of an embodiment of the present invention.

The terminology used in the description of the various embodiments herein is for the purpose of describing particular examples only and is not intended to be limiting.

As used herein, the singular forms "a", "an", and "the" include plural referents unless the context clearly dictates otherwise or intends to limit the number of devices. In another aspect, the terms "comprise" and "include" are intended to be inclusive, meaning that there may be additional devices other than the listed devices. When a device is referred to as being "connected" or "coupled" to another device, the device may be connected or coupled to the other device directly or by an intermediate device. When a device describing a layer, region or substrate is referred to as being "on" another device, it is meant that it is directly on another device or there may be an intermediate device between each other. Relatively speaking, when the device is referred to as being "directly on" another device, the intermediate device is not present between each other. In addition, the order in which the embodiments are described should not be construed to imply that the operations or steps are necessarily literally dependent, and that alternative embodiments may perform the steps, operations, methods, etc. in an order other than that described herein.

In this context, each layer and/or region is characterized as having a conductivity type such as n-type or p-type, which refers to the majority carrier species in the layer and/or region. The n-type material includes an equilibrium excess electron, and the p-type material includes an equilibrium excess hole. Some materials may be labeled with $^+$ or $^-$ (e.g., $n^+$, $n^-$, $p^+$, $p^-$) to indicate a majority carrier concentration relatively larger ($^+$) or smaller ($^-$) than that of another layer or region, the notation not representing a particular concentration of the carrier. In the drawings, the thicknesses of the various layers and/or regions are enlarged to make the drawings clearer.

Figure 1B:
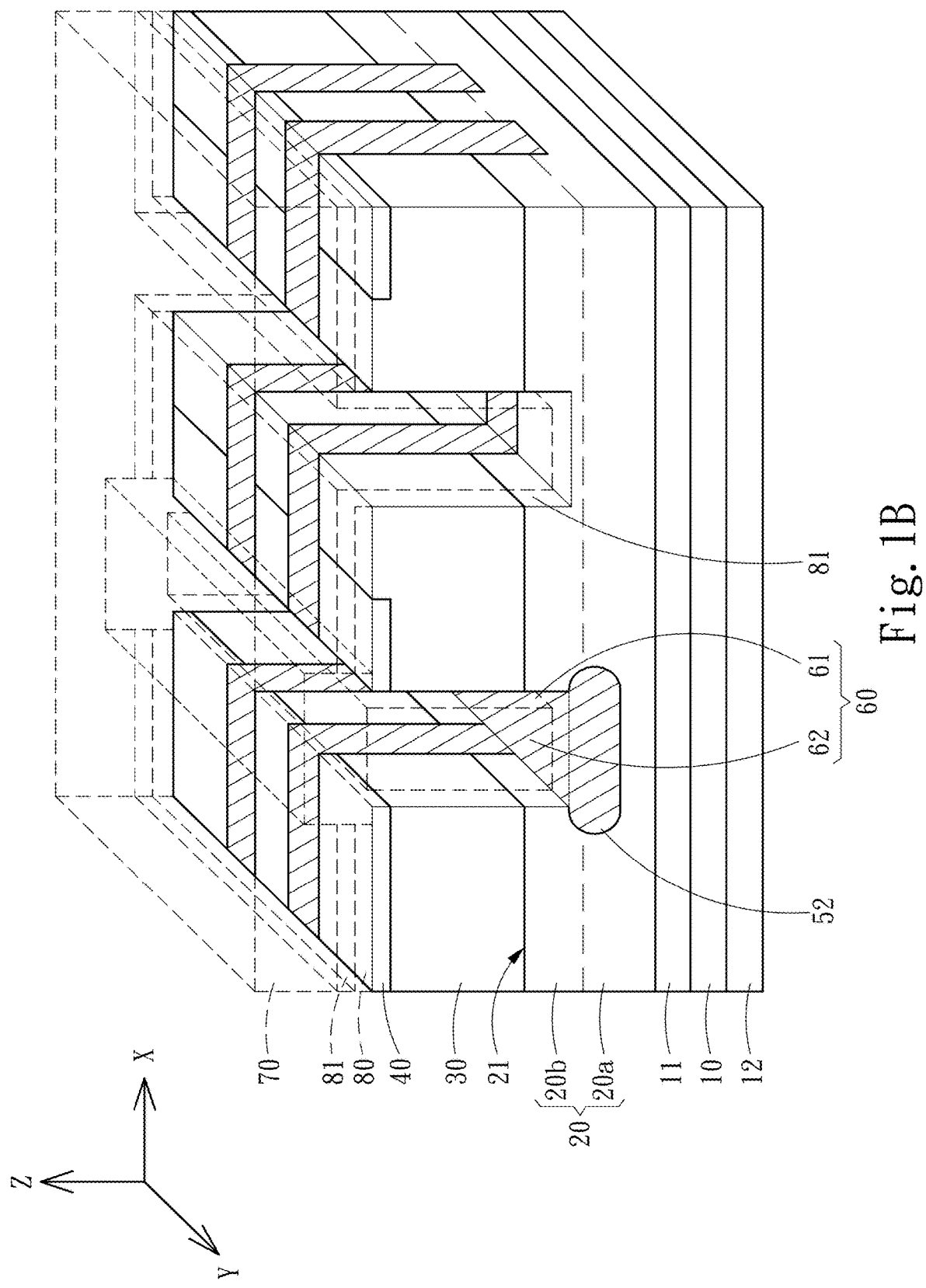

The invention provides a silicon carbide semiconductor device, in particular to a monolithically integrated trench Metal-Oxide-Semiconductor Field-Effect Transistor (MOSFET) with segmentally surrounded Schottky diode. As seen in FIG. 1A and FIG. 1B, schematic diagrams of perspective structure views of an embodiment of the present invention are shown. FIG. 1A omits part of the devices of FIG. 1B, and FIG. 1B presents part of the devices in dashed lines for ease of understanding. The silicon carbide semiconductor device includes a first silicon carbide semiconductor layer 10, a second silicon carbide semiconductor layer 20, a third silicon carbide semiconductor layer 30, a first semiconductor region 40, a second semiconductor region 50, a gate region 60, and a metal electrode 70.

The first silicon carbide semiconductor layer 10 has a first conductivity type, which is an n-type in this embodiment. The first silicon carbide semiconductor layer 10 is an $n^+$ silicon carbide substrate. A buffer layer 11 is provided on the first silicon carbide semiconductor layer 10, and a metal drain layer 12 is provided below the first silicon carbide semiconductor layer 10. The second silicon carbide semiconductor layer 20 is provided on the buffer layer 11, and includes an $n^-$-type drift layer 20a and an n-type current spreading layer 20b. The third silicon carbide semiconductor layer 30 is provided on the n-type current spreading layer 20b, and the third silicon carbide semiconductor layer 30 is a p-type base region provided on an upper surface 21 of the second silicon carbide semiconductor layer 20. The first semiconductor region 40, which is an $n^+$ source region, is formed in the third silicon carbide semiconductor layer 30. The $n^-$-type drift layer 20a has a doping concentration in a range between 5E14 and 5E16, the n-type current spreading layer 20b has a doping concentration in a range between 1E16 and 5E18, and the p-type base region has a doping concentration in a range between 1E17 and 5E19. The $n^+$ source region has a doping concentration in a range between 1E18 and 5E20. In an embodiment, the buffer layer 11, the second silicon carbide semiconductor layer 20, and the third silicon carbide semiconductor layer 30 are epitaxial layers formed by epitaxial growth.

The silicon carbide semiconductor device includes a plurality of trenches T formed by an etching process. The plurality of trenches includes a first trench T1 and a second trench T2 spaced apart and extending through in a first horizontal direction. In this embodiment, the first horizontal direction is the Y-axis as shown in the drawings. The first trench T1 perpendicularly penetrates through the first semiconductor region 40 and the third silicon carbide semiconductor layer 30 into the second silicon carbide semiconductor layer 20, and the second trench T2 perpendicularly penetrates through the third silicon carbide semiconductor layer 30 into the second silicon carbide semiconductor layer 20. The depths and widths of the first trench T1 and the second trench T2 may be the same or different depending on the choice of application or manufacturing method. For example, the first trench T1 has a depth in a range between 1 μm and 2.5 μm and a width in a range between 0.5 μm and 1.5 μm. The second trench T2 has a depth in a range between 1 μm and 2.5 μm and a width in a range between 0.5 μm and 2 μm. Further, in this embodiment, the first semiconductor region 40 is formed on a portion of an upper surface of the third silicon carbide semiconductor layer 30 by ion implantation, as shown in FIG. 1A and FIG. 1B.

Figure 2:
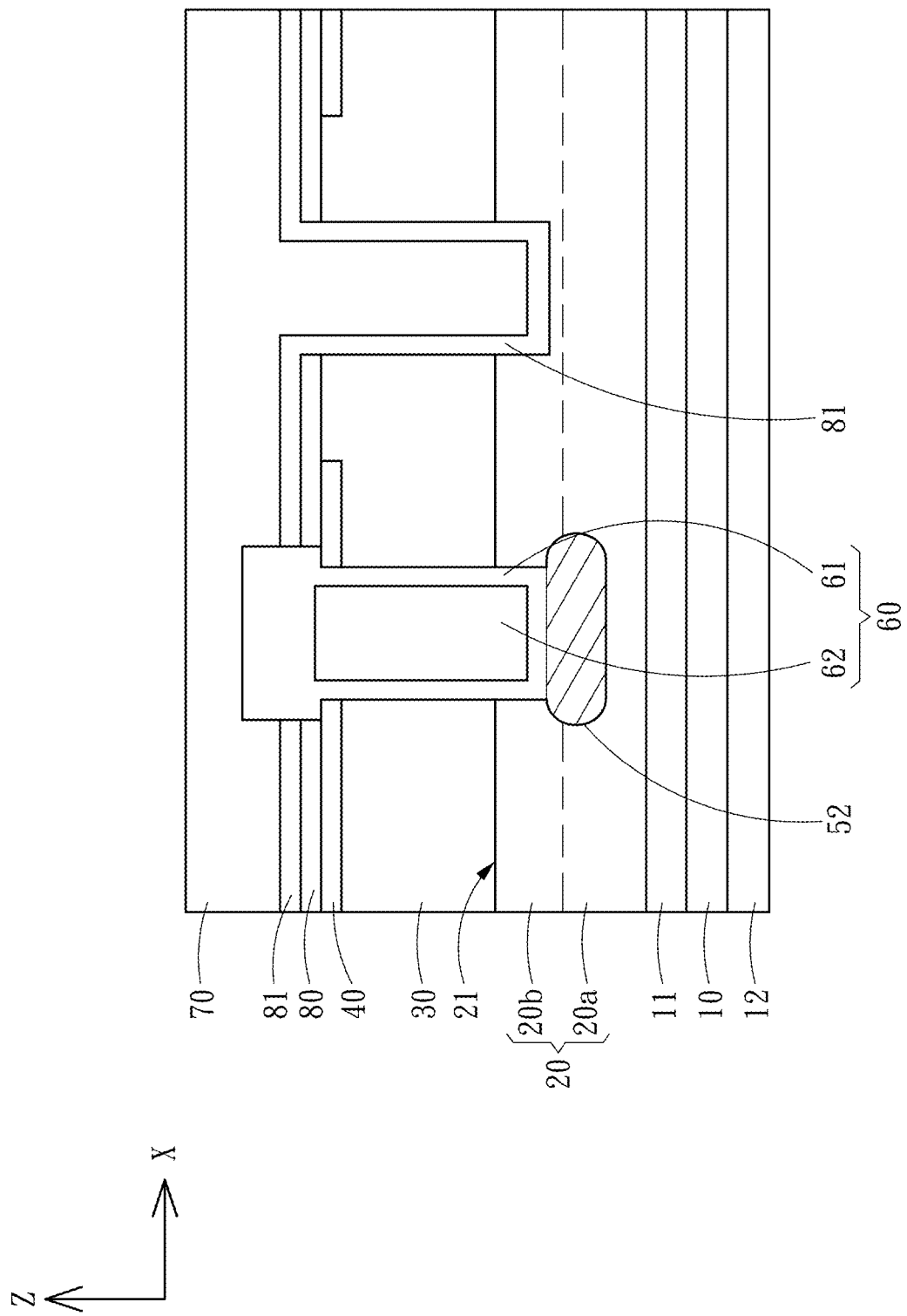
FIG. 2 is a front view of FIG. 1B.
Figure 3:
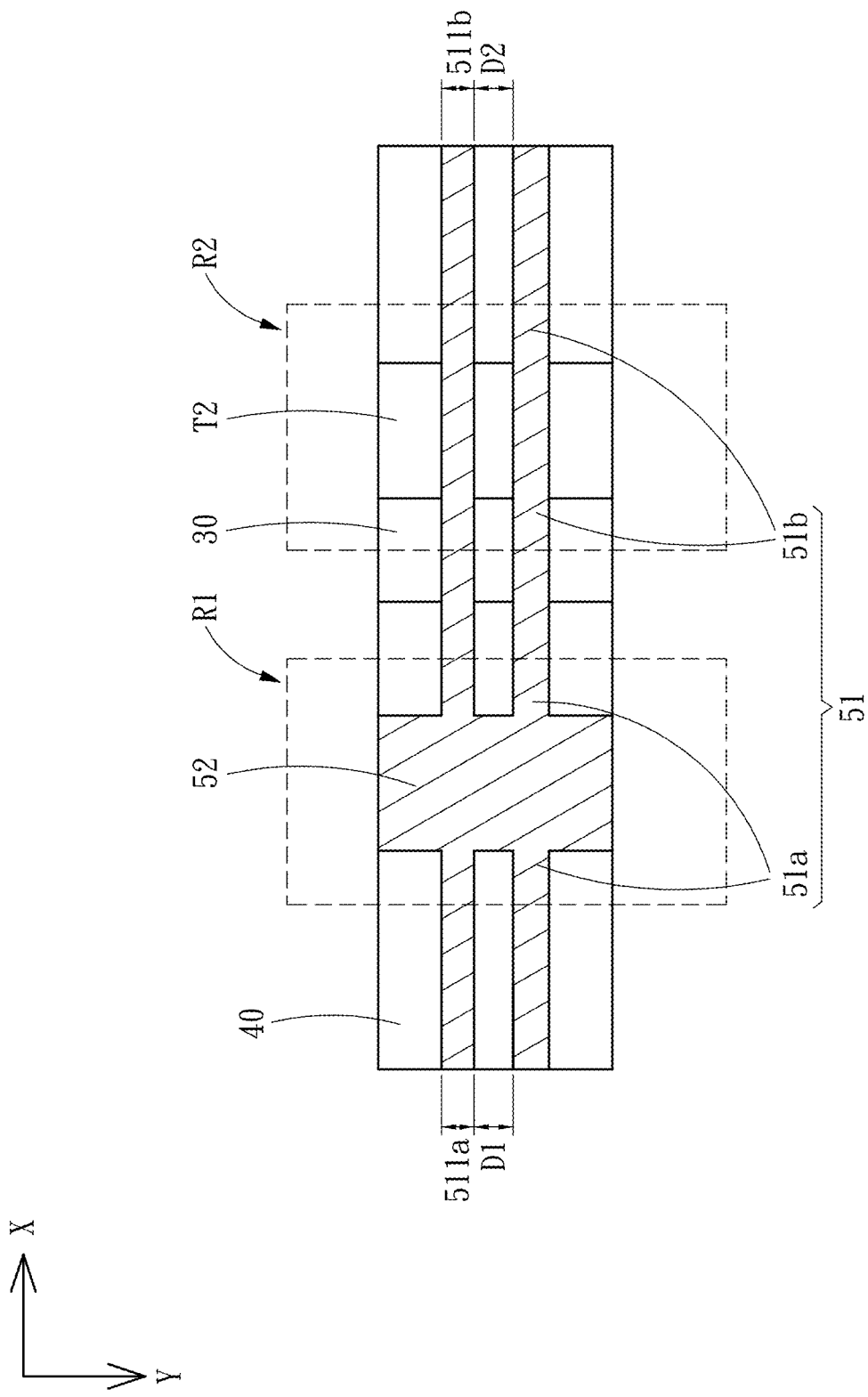
FIG. 3 is a top view of FIG. 1A.
Figure 5:
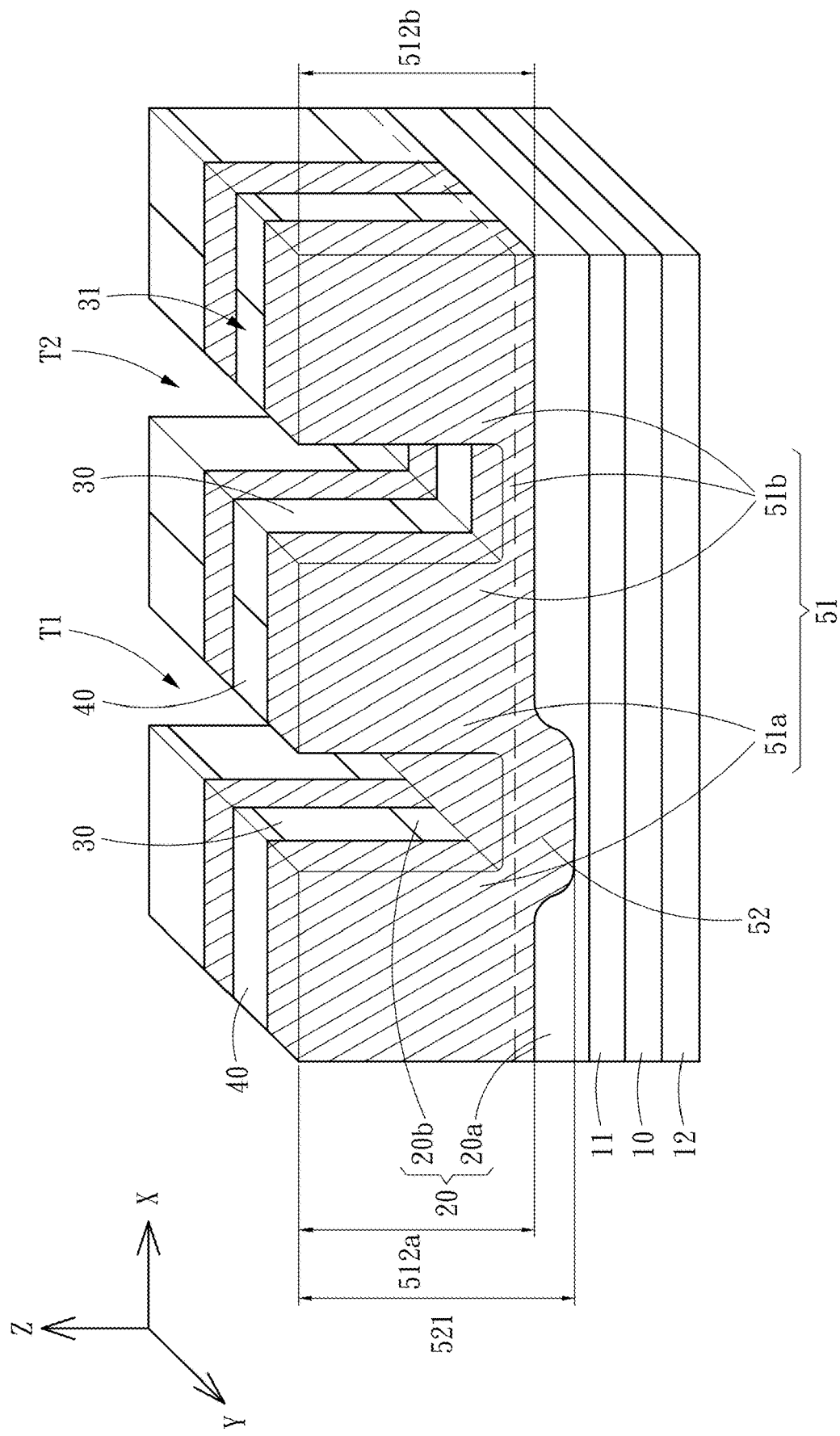
FIG. 5 is a cross-section view along A-A of FIG. 1A.
Figure 6A:
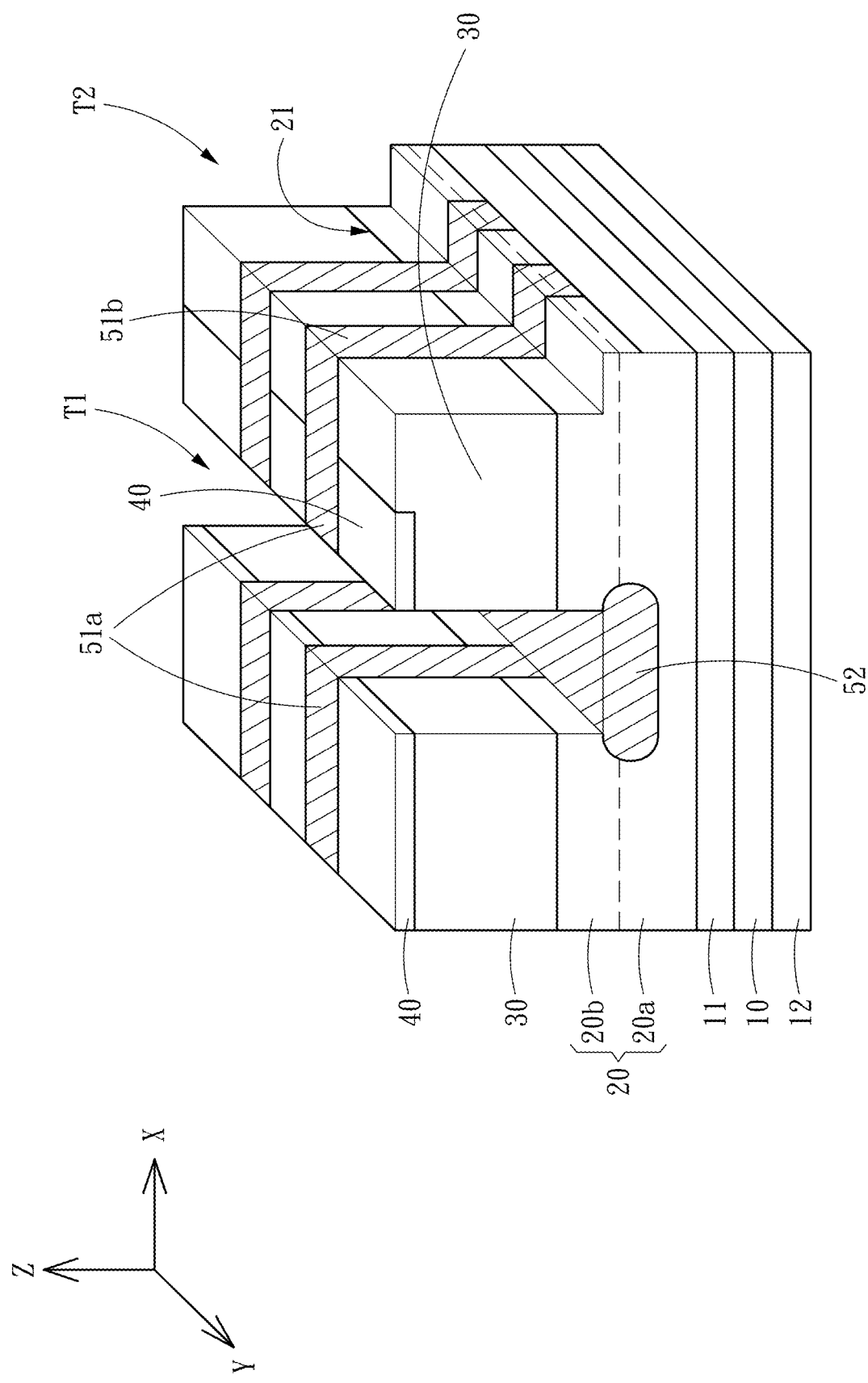
FIG. 6A, FIG. 6B, and FIG. 6C are cross-section views along B-B of FIG. 1A.
Figure 7:
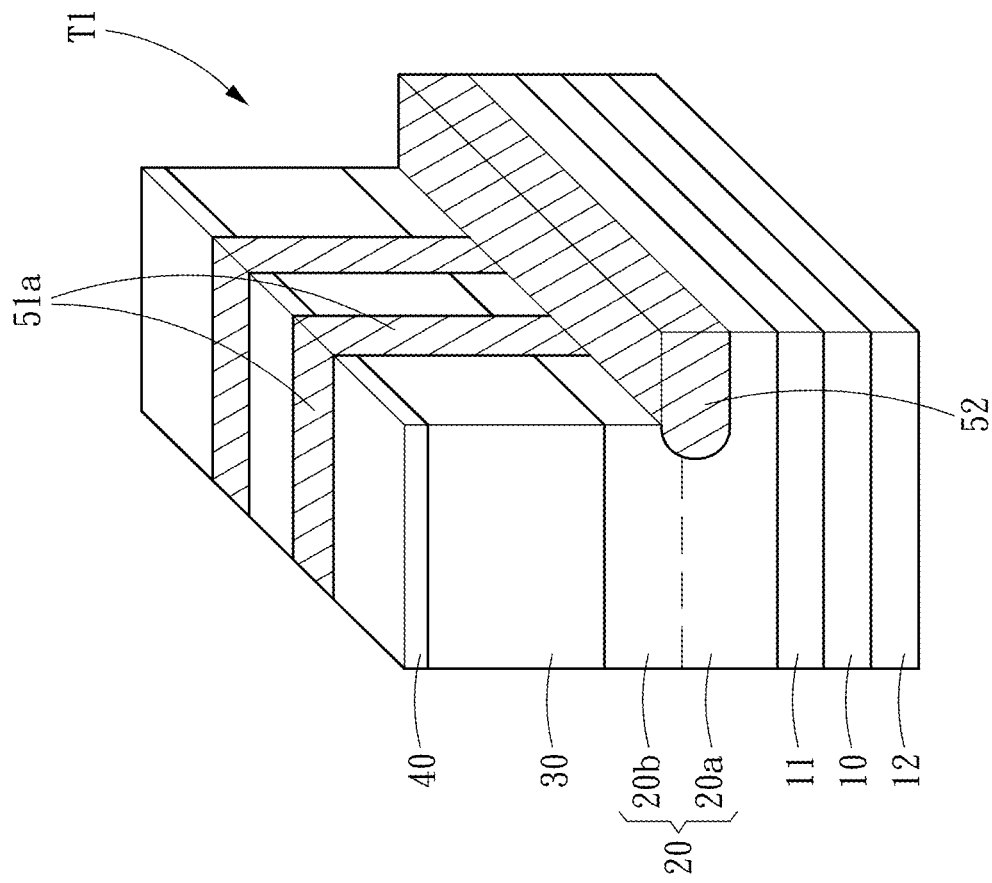
FIG. 7 is a cross-section view along C-C of FIG. 1A.
Figure 7:
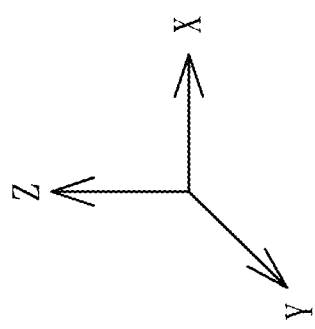

Further, referring to FIG. 2 and FIG. 3, a front view of FIG. 1B and a top view of FIG. 1A are respectively shown, and referring to FIG. 5, FIG. 6A and FIG. 7, cross-section views of FIG. 1A along A-A, B-B, and C-C, respectively. The second semiconductor region 50 includes a first portion 51 and a second portion 52. The first portion 51 is a plurality of segmental implant regions which is spaced apart, segmentally implanted and formed in the third silicon carbide semiconductor layer 30 and the second silicon carbide semiconductor layer 20. The first portion 51 extends in a second horizontal direction. In this embodiment, the second horizontal direction is the X-axis as shown in the drawings. Further, the first portion 51 of the second semiconductor region 50 includes a plurality of pickup regions 51a and a plurality of slice regions 51b, wherein the first portion 51 surrounding the first trench T1 is defined as the plurality of pickup regions 51a, and the first portion 51 surrounding the second trench T2 is defined as the plurality of slice regions 51b. The second semiconductor region 50 has an implantation depth ranged between 0.8 μm and 3.0 μm, wherein the implantation depth is ranged from an upper surface 31 of the third silicon carbide semiconductor layer 30 to the second silicon carbide semiconductor layer 20 (as shown in FIG. 1A), or ranged from a top surface of the first semiconductor region 40 to the second silicon carbide semiconductor layer 20.

Figure 4:
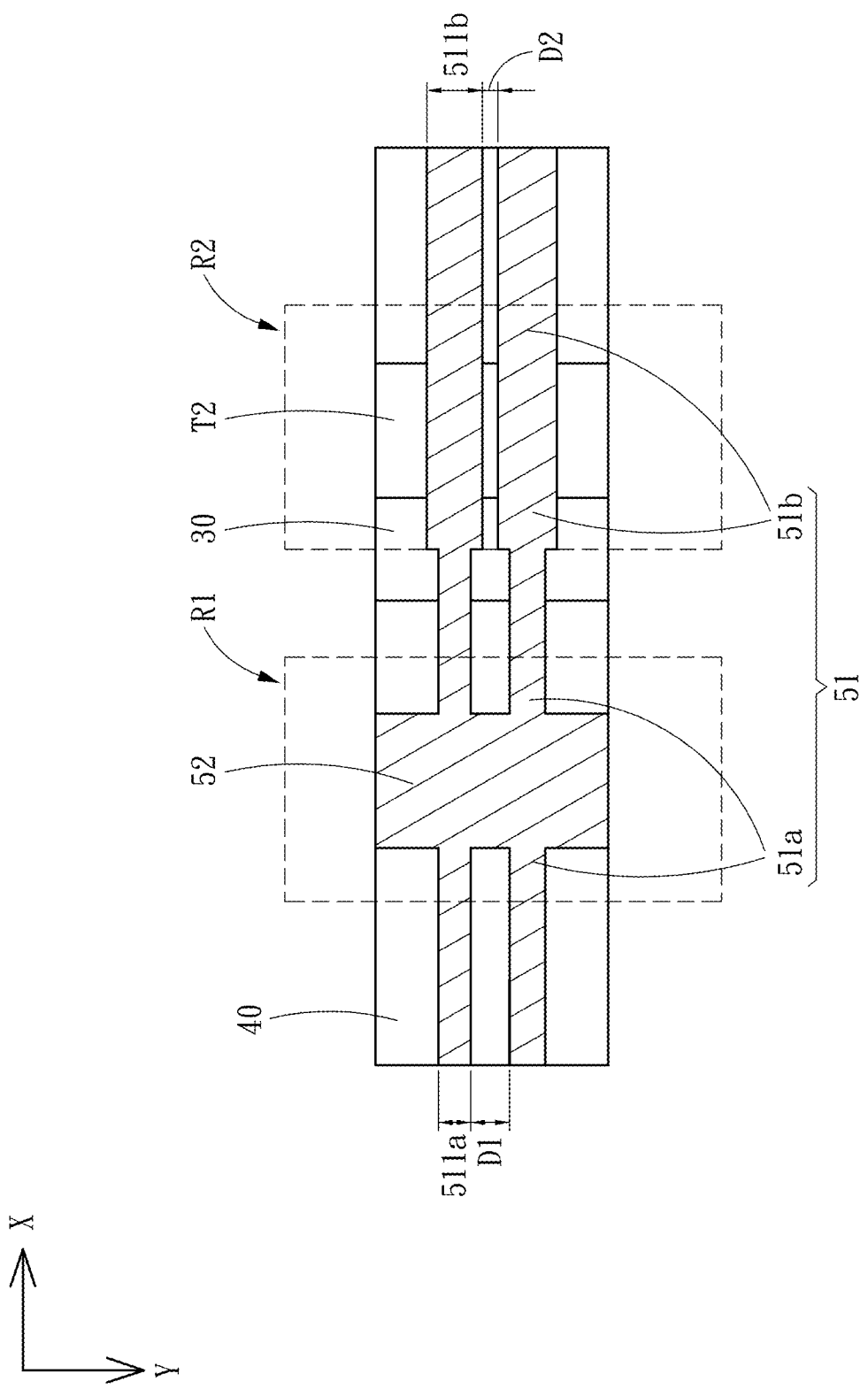
FIG. 4 is a top view of another embodiment of the present invention.

In the embodiments of FIG. 1A, FIG. 1B, FIG. 2, and FIG. 3, a width 511a and a depth 512a of each pickup region 51a are the same as a width 511b and a depth 512b of each slice region 51b. In an embodiment, the width 511a and the width 511b are in a range between 0.5 μm and 1.5 μm, and the depth 512a and the depth 512b are in a range between 0.8 μm and 2.5 μm. However, in other embodiments, the width 511a of each pickup region 51a is different from the width 511b of each slice region 51b. In one embodiment of FIG. 4, the width 511b is greater than the width 511a, thereby further limiting electric leakage. However, in other embodiment, the width 511b is less than the width 511a, and the depth 512a of each pickup region 51a may be greater or less than the depth 512b. In addition, the plurality of pickup regions 51a has a doping concentration equal to, greater than, or less than a doping concentration of the plurality of slice regions 51b, and the doping concentration is in a range between 1E18 and 5E20. In addition, the plurality of pickup regions 51a is spaced with each other with a distance D1 in a range between 0.5 μm and 3 μm. The plurality of slice regions 51b is spaced with each other with a distance D2 in a range between 0.5 μm and 3 μm.

The second portion 52 is formed in a region of the second silicon carbide semiconductor layer 20 below the first trench T1 and extends in the first horizontal direction. The second portion 52 has a depth 521 ranged between 1.3 μm and 3 μm, wherein the depth 521 is ranged from the upper surface 31 to a lowermost portion of the second portion 52. The second portion 52 is a p$^+$ shield region and has a doping concentration in a range between 1E18 and 5E20. It is understandable that the depth 521 of the second portion 52 is greater than the depth 512a of the plurality of pickup regions 51a and/or the depth 512b of the plurality of slice regions 51b. Referring to FIG. 1B and FIG. 2, a metal silicide layer 80 is formed on the surfaces of the third silicon carbide semiconductor layer 30 and the first semiconductor region 40, and a metal layer 81 is formed on the metal silicide layer 80 and an inner wall surface of the second trench T2. In the embodiment, the metal silicide layer 80 is nickel silicide (NiSi), the metal layer 81 is an alloy such as Ti/TiN, and the metal electrode 70 is AuCu. The gate region 60 includes a gate insulating layer 61 and a poly gate 62. The gate insulating layer 61 is formed on a portion of the surface of the first semiconductor region 40 and extends longitudinally along the side wall of the first trench T1 to be covered on the surfaces of parts of the third silicon carbide semiconductor layer 30 and the second silicon carbide semiconductor layer 20. The poly gate 62 is formed on the gate insulating layer 61. The metal electrode 70 is covered on an upper surface of the gate insulating layer 61 and the metal layer 81 and filled into the second trench T2. A side wall and a bottom wall of the metal layer 81 form a Schottky junction with the second silicon carbide semiconductor layer 20 in the second trench T2, and the metal electrode 70 is covered on the metal layer 81.

Figure 6B:
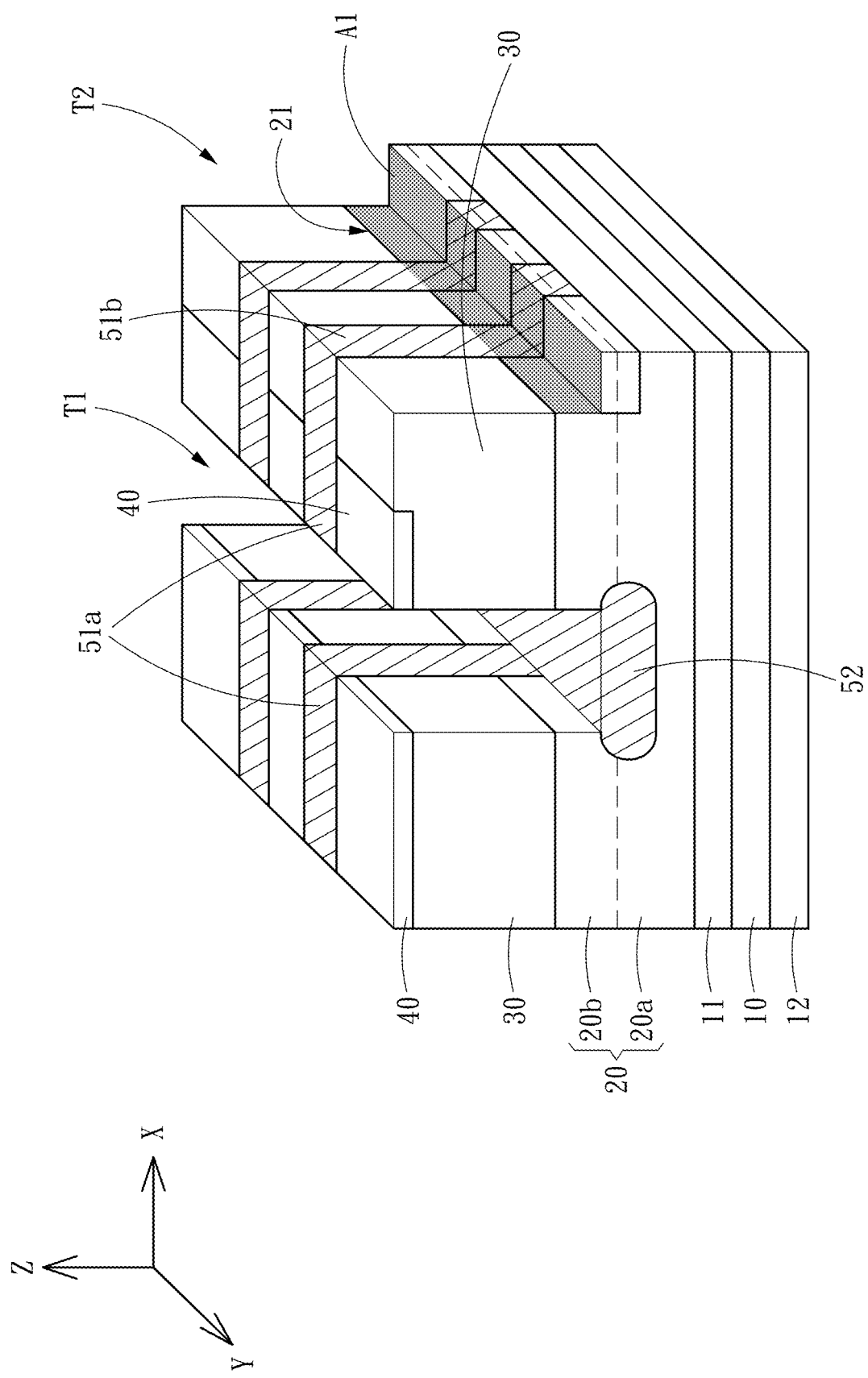
Figure 6C:
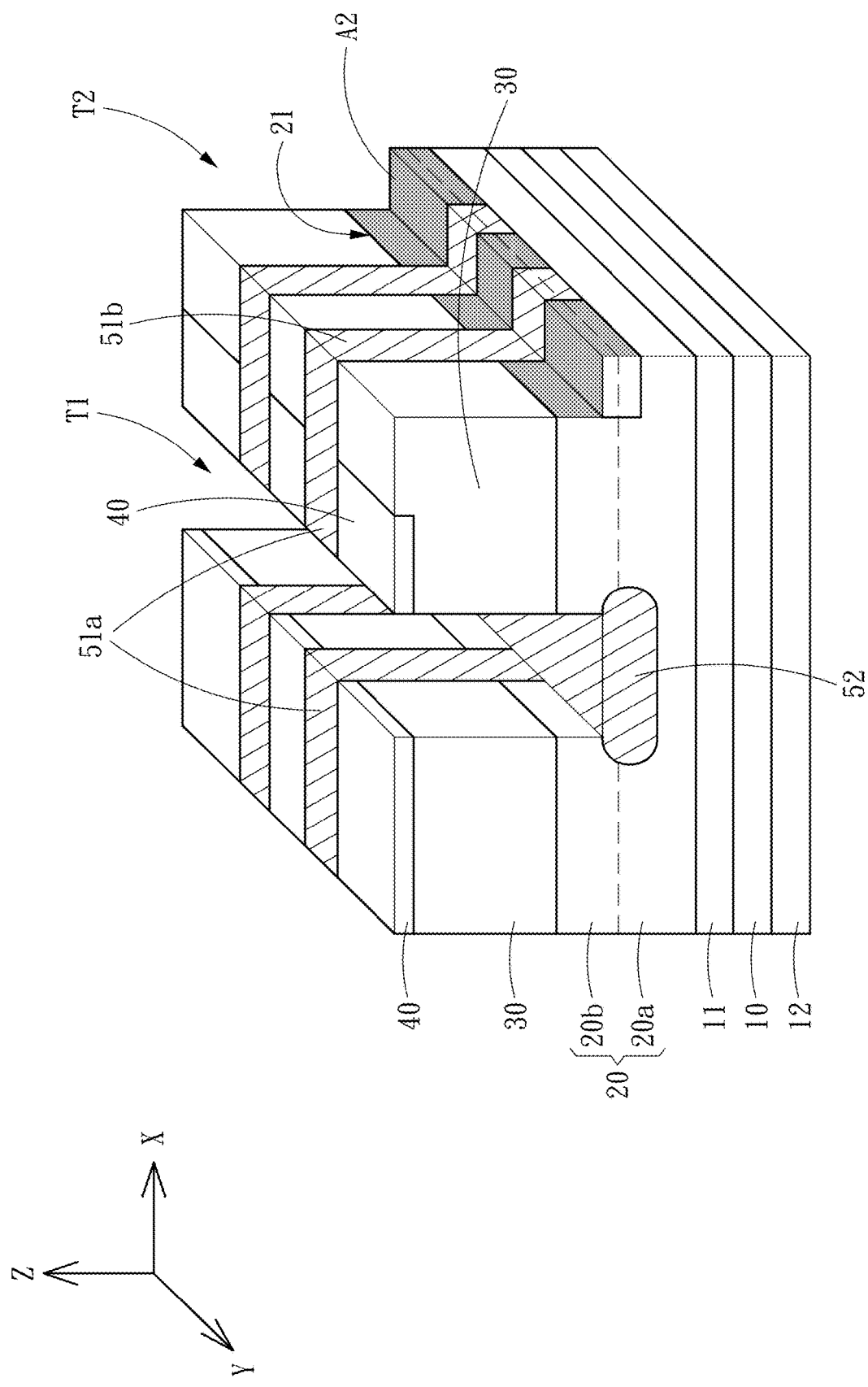

Referring to FIG. 6B and FIG. 6C, in the present invention, the inner wall surface of the second trench T2 below the upper surface 21 of the second silicon carbide semiconductor layer 20 has a first area A1 which includes part of the surface of the slice regions 51b. The Schottky junction has a second area A2 which excludes part of the surface of the slice regions 51b. The second area A2 is less than the first area A1. Further, as shown in FIG. 3, a first area R1 of the silicon carbide semiconductor device is defined as a Metal-Oxide-Semiconductor Field-Effect Transistor (MOSFET), and the second area R2 of the silicon carbide semiconductor device is defined as to a Junction Barrier Schottky diode (JBS). Further, the position where the first semiconductor region 40 is formed on the third silicon carbide semiconductor layer 30 is determined according to the arrangement of the MOSFET.

In the conventional art, the electric leakage of JBS occurs in the first area A1 as described above. However, in the present invention, the electric leakage of JBS will be limited to occur only in the second area A2 due to a monolithically integrated trench MOSFET with segmentally surrounded Schottky diode. Namely, the current flowing from the metal electrode 70 is restricted within a section between the adjacent slice regions 51b. Therefore, the electric leakage of the silicon carbide semiconductor device of the present invention can be improved under the same size, and the reverse diode conduction voltage (Vsd) can be relatively low; on the other hand, the silicon carbide semiconductor device of the present invention can increase the cell density, i.e., decrease the cell pitch.

Figure 8A:
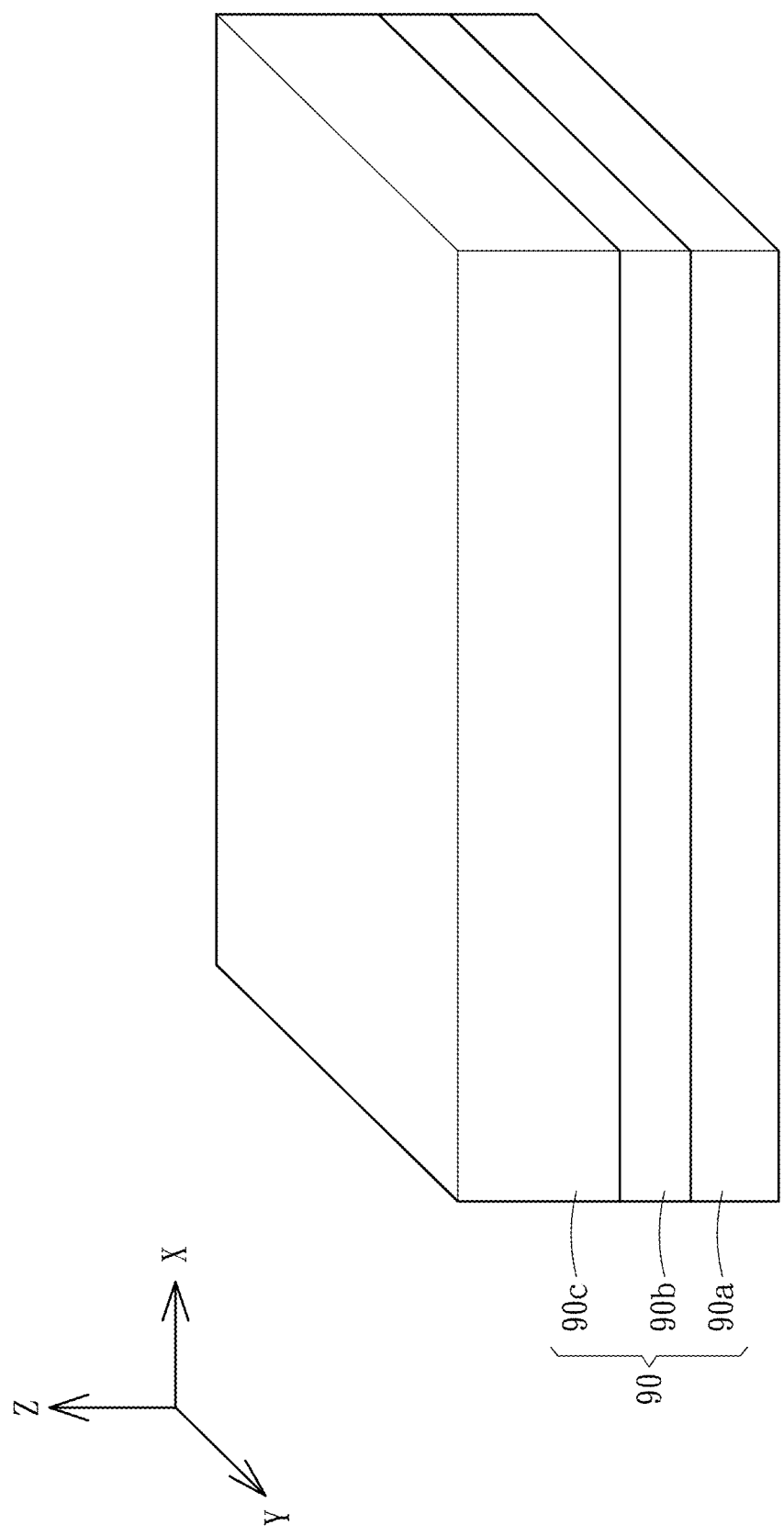
FIG. 8A, FIG. 8B, FIG. 8C, FIG. 8D, FIG. 8E, FIG. 8F, FIG. 8G, and FIG. 8H are manufacturing process diagrams of an embodiment of the present invention.
Figure 8B:
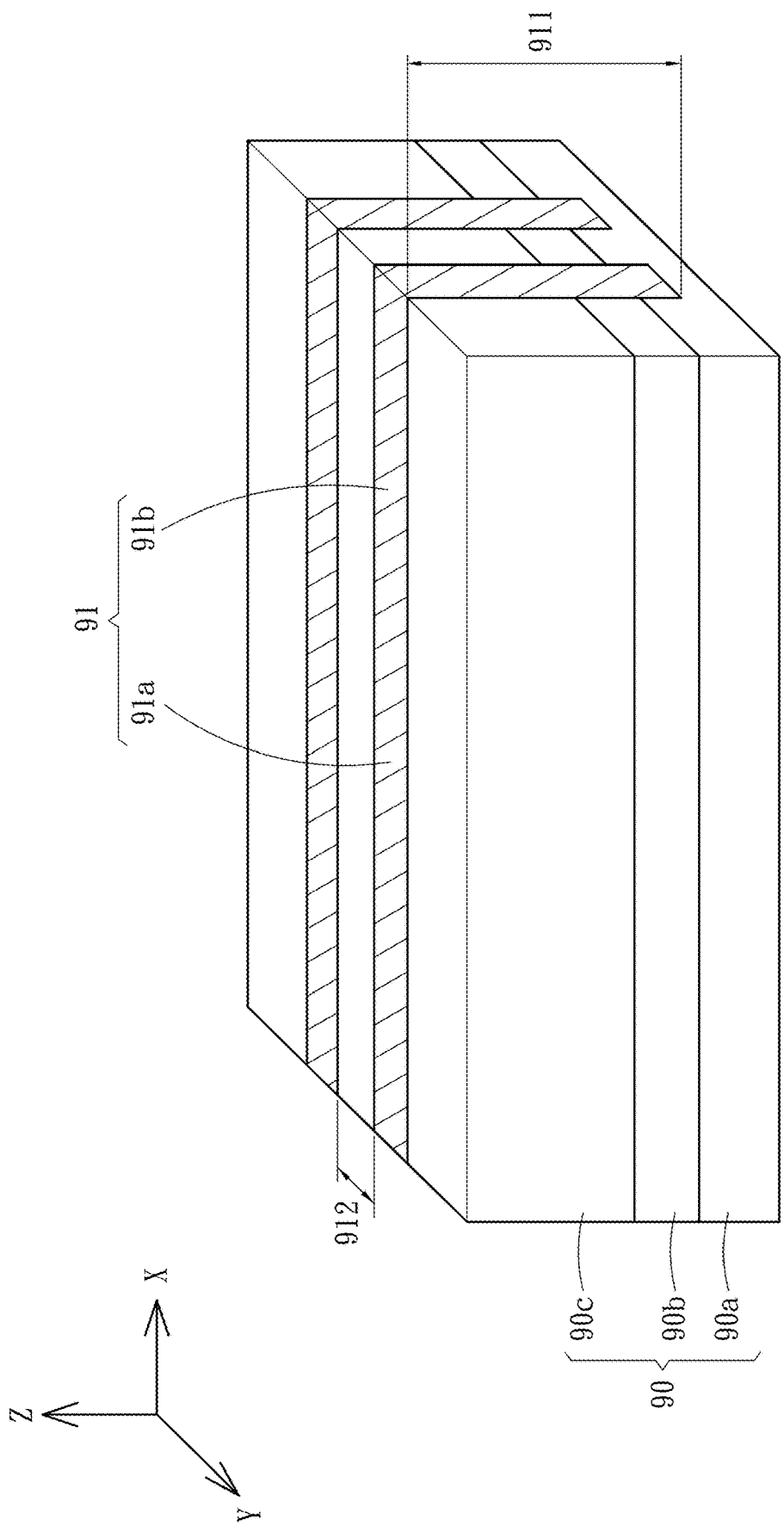
Figure 8C:
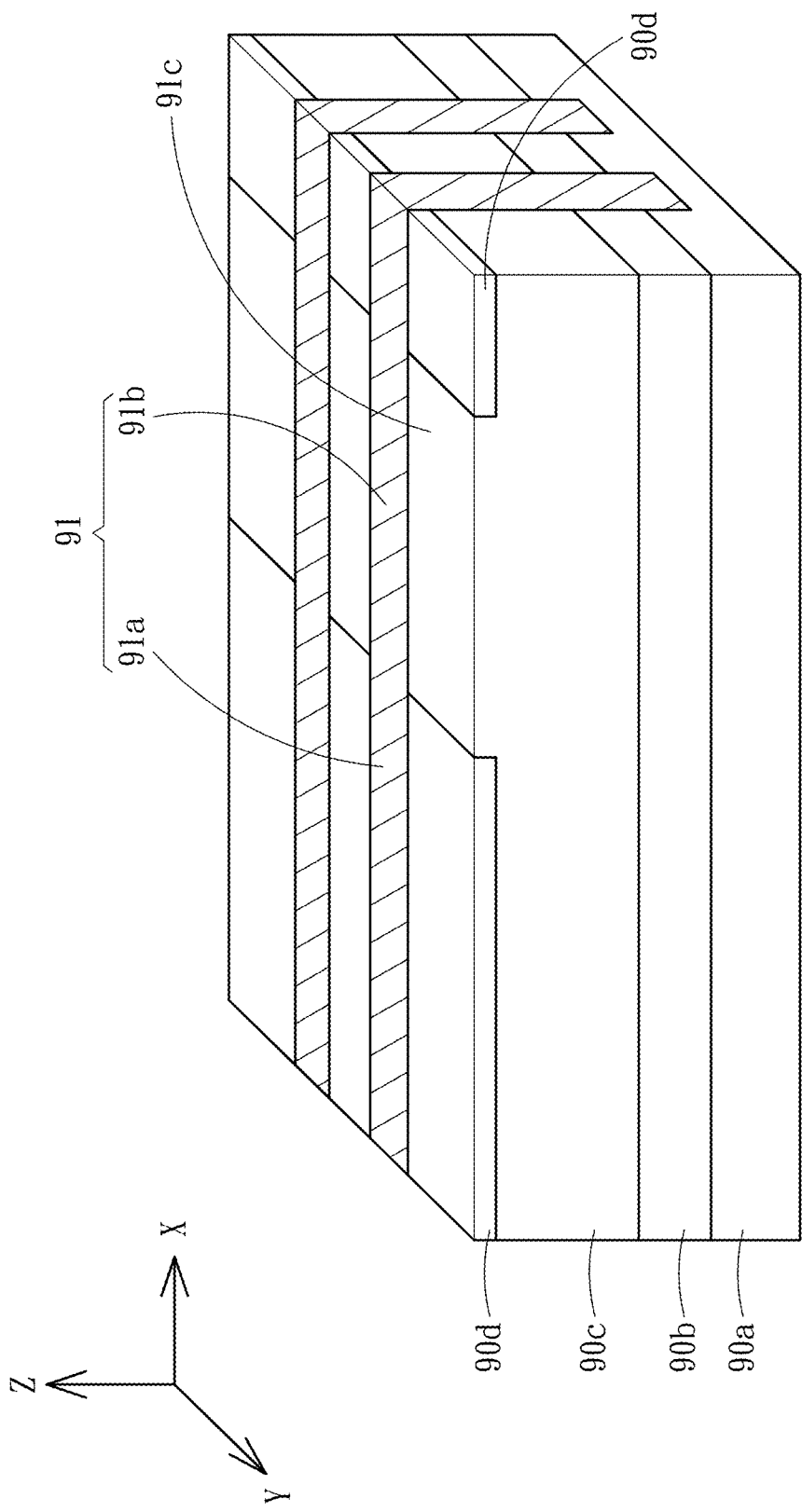

FIG. 8A, FIG. 8B, FIG. 8C, FIG. 8D, FIG. 8E, FIG. 8F, FIG. 8G, and FIG. 8H are manufacturing process diagrams of an embodiment of the present invention. Referring to FIG. 8A, a semiconductor substrate 90 is provided in which a drift layer 90a, a current spreading layer 90b and a base layer 90c are formed, the drift layer 90a and the current spreading layer 90c have a first conductivity type and the base layer 90c has a second conductivity type. In this embodiment, the first conductivity type and the second conductivity type are n-type and p-type, respectively. The drift layer 90a, the current spreading layer 90b, and the base layer 90c are formed by epitaxial growth. Referring to FIG. 8B, a plurality of first doped regions 91 disposed segmentally and extending in a second horizontal direction are implanted on the semiconductor substrate 90, each of the plurality of first doped regions 91 has a depth 911 at least through the base layer 90c, and the plurality of first doped regions 91 are spaced apart from each other by a distance 912, parameters of the depth 911 and the distance 912 are described with reference to the previous embodiments. The first doped region 91 includes a plurality of pickup regions 91a corresponding to regions of the MOSFET and a plurality of slice regions 91b corresponding to regions of the JBS which are defined in advance. Referring to FIG. 8C, a source region 90d having the first conductivity type is formed on part of the upper surface region of the base layer 90c, i.e., the region corresponding to the MOSFET.

Figure 8D:
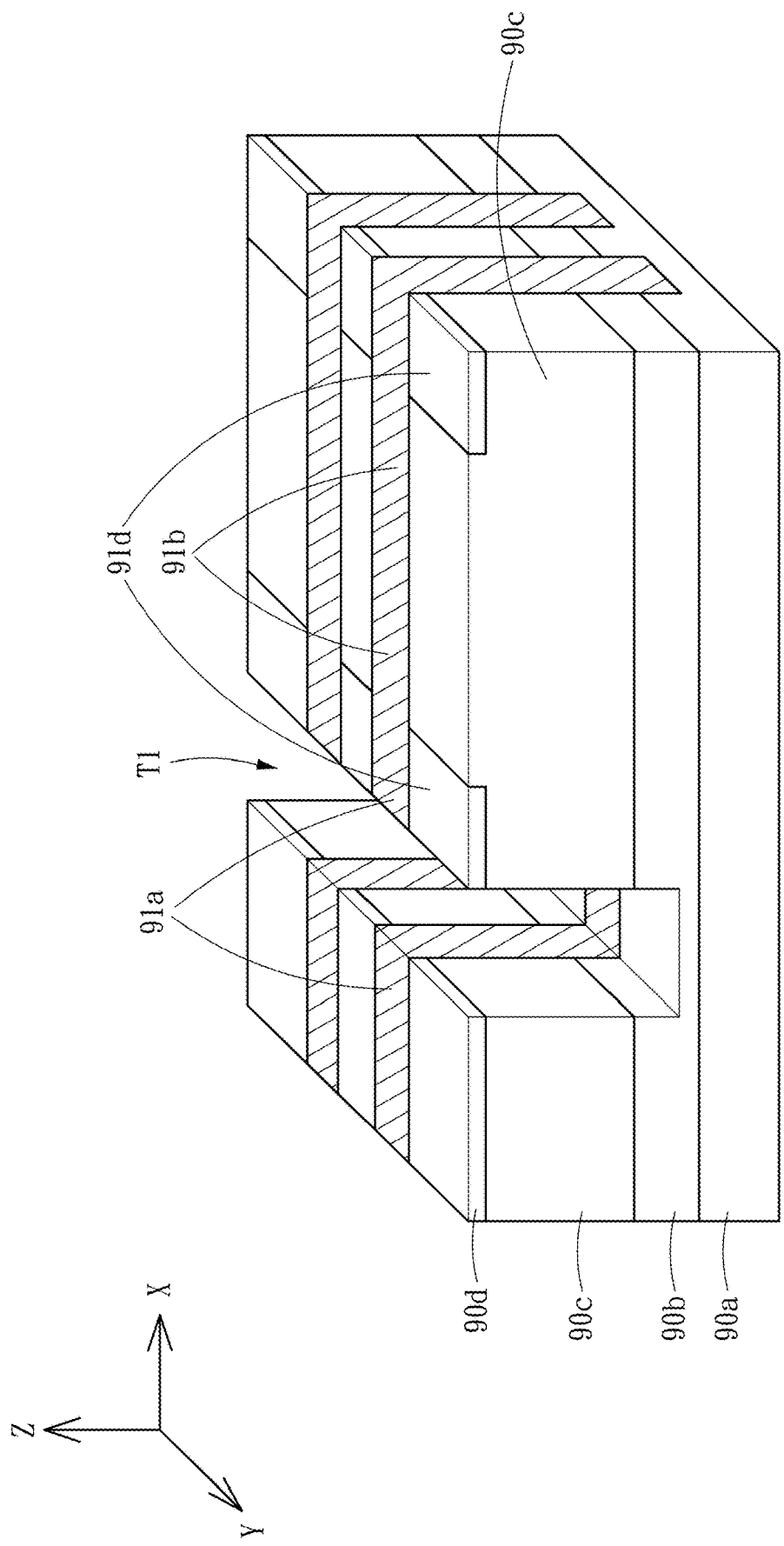
Figure 8E:
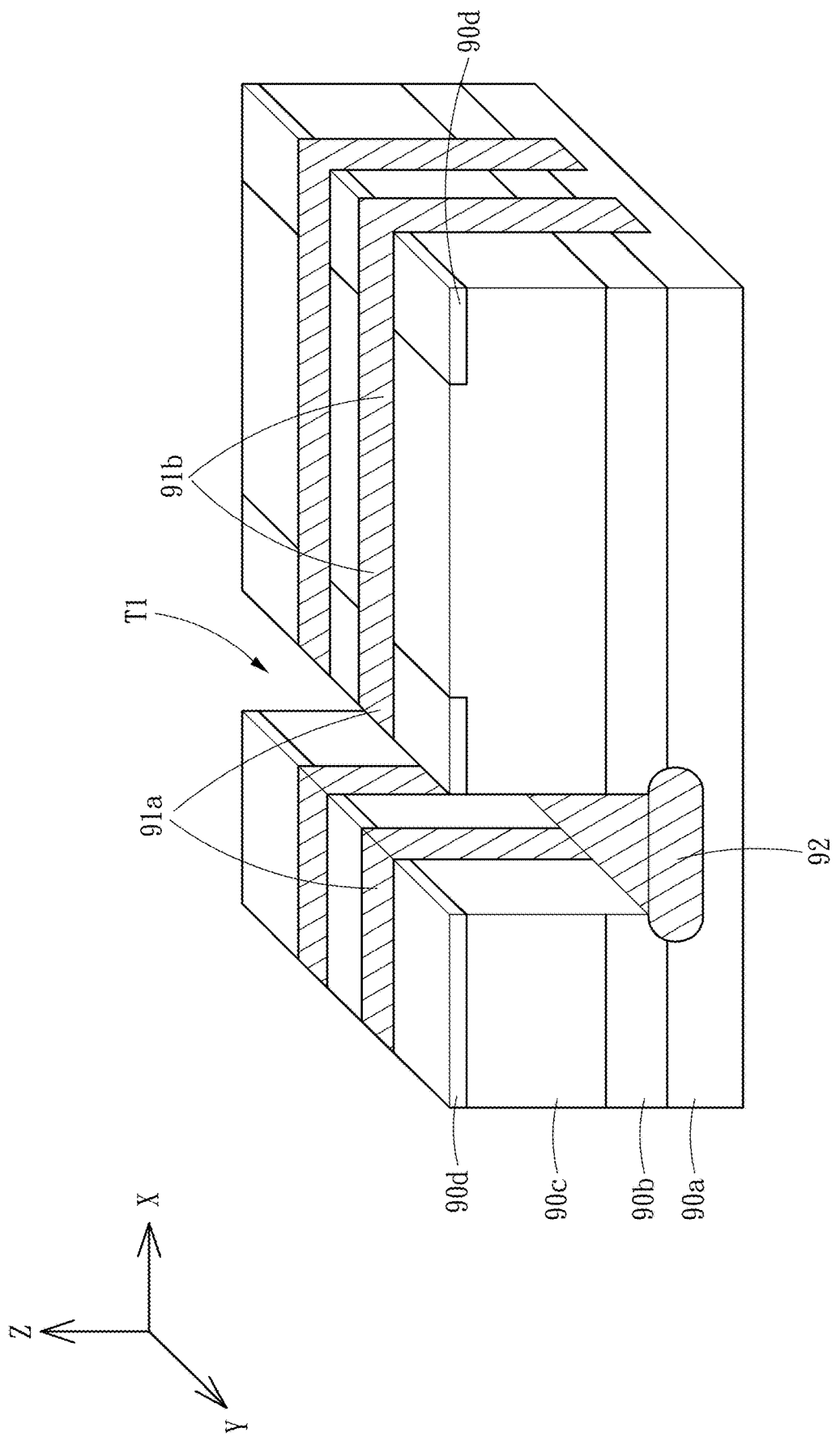
Figure 8F:
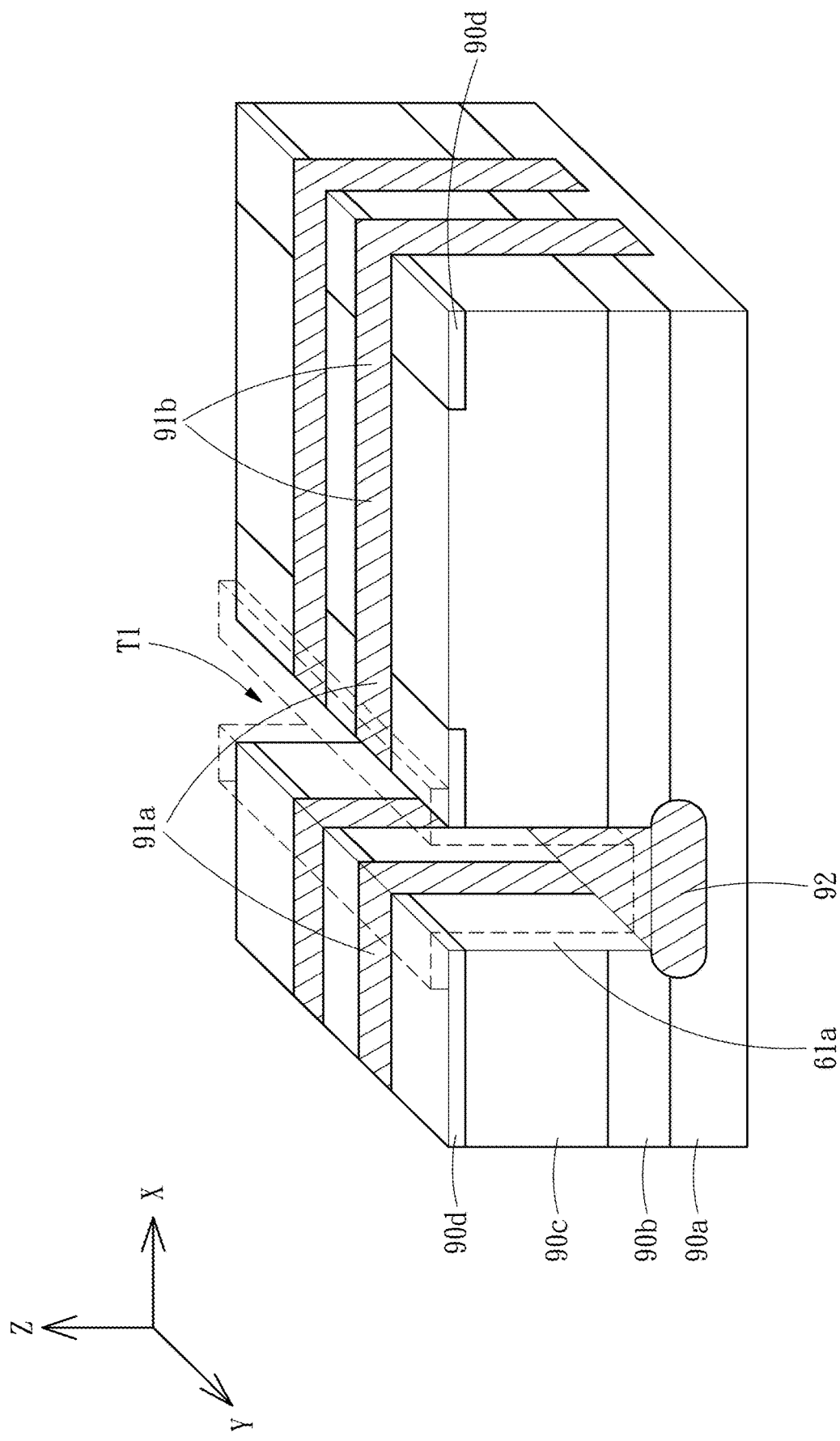
Figure 8G:
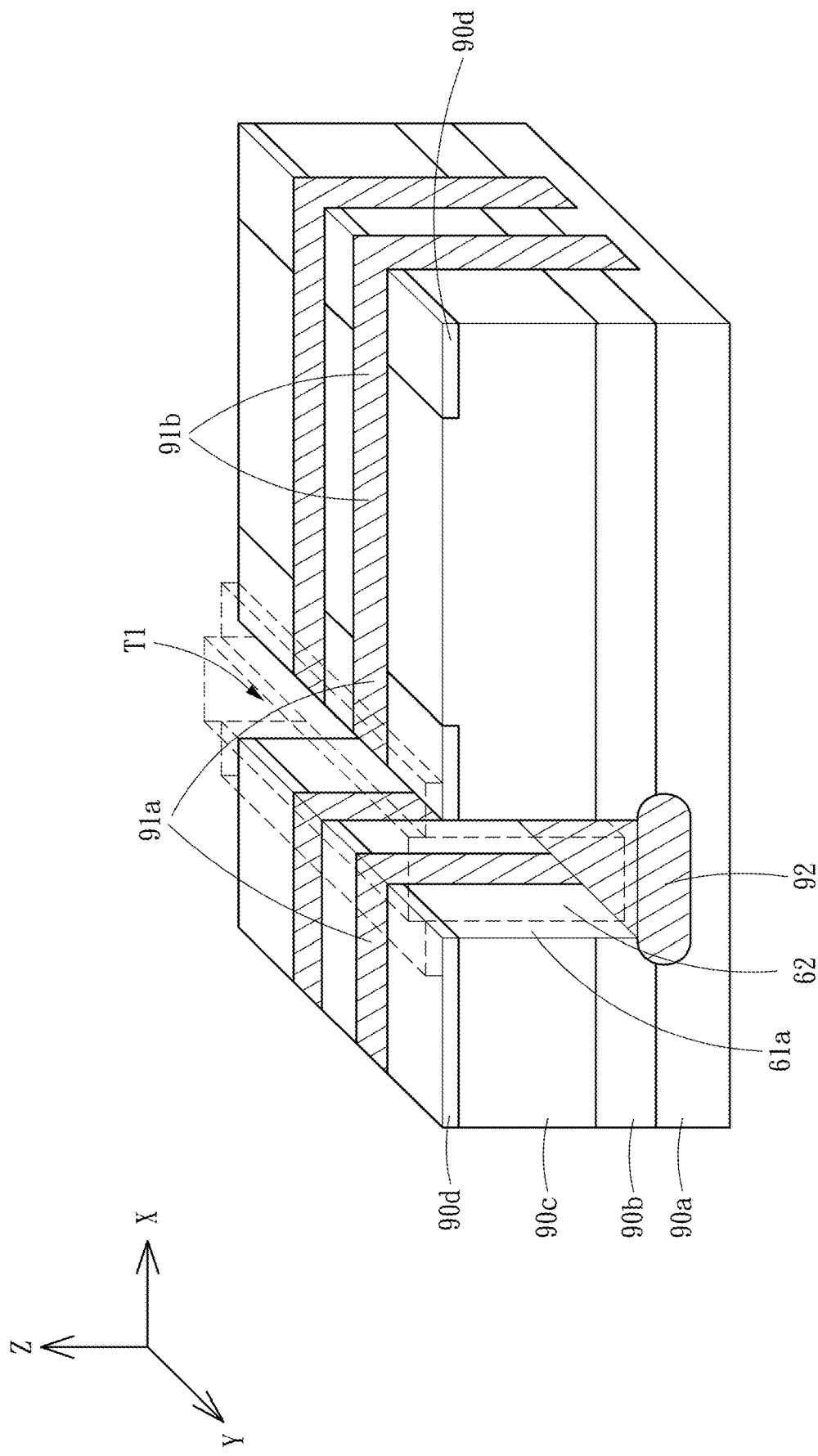
Figure 8H:
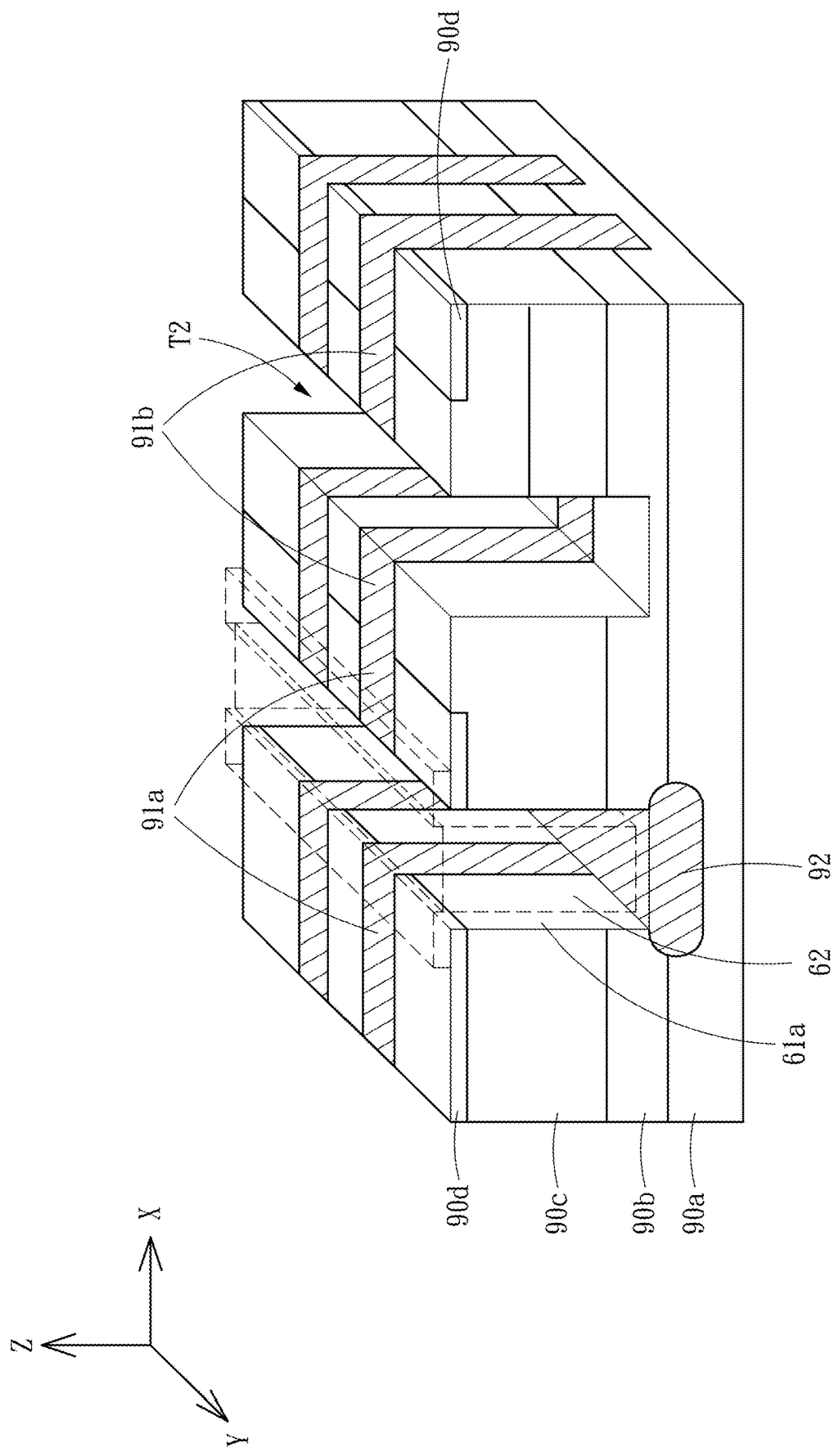

Referring to FIG. 8D, a first trench T1 is etched on the semiconductor substrate 90, and the first trench T1 is spaced apart in the second horizontal direction and passes through the semiconductor substrate 90 in a first horizontal direction substantially orthogonal to the second horizontal direction. The first trench T1 perpendicularly penetrates into the current spreading layer 90b. Referring to FIG. 8E, the current spreading layer 90b below the first trench T1 is implanted with a second doped region 92 having the same conductivity type as the first doped region 91. Then, a gate region is formed in the first trench T1, as see in FIG. 8F. First, a first gate insulating layer 61a is formed on a bottom wall and a side wall of the first trench T1 and an upper surface of the source region 90d adjacent to the first trench T1, and then a poly gate 62 is formed on the first gate insulating layer 61a in the first trench T1, as shown in FIG. 8G. Referring to FIG. 8H, a second trench T2 is formed on the semiconductor substrate 90, the second trench T2 and the first trench T1 are spaced apart in the second horizontal direction and pass through the semiconductor substrate 90 in the first horizontal direction, and the second trench T2 perpendicularly penetrates into the current spreading layer 90b. Thereafter, devices such as the metal silicide layer 80, the metal layer 81, and the metal electrode 70 are formed, as described above with reference to FIG. 1A and FIG. 1B.

According to the above manufacturing method, the first doped region 91 is the first portion 51 of the second semiconductor region 50, and the second doped region 92 is the second portion 52 of the second semiconductor region 50. In the embodiment, the MOSFET and the first doped region 91 of the JBS diode can be subjected to ion implantation by a same photomask, so that the accuracy of manufacturing process and device configuration can be improved.

What is claimed is:
1. A silicon carbide semiconductor device, comprising:
   a first silicon carbide semiconductor layer, having a first conductivity type;
   a second silicon carbide semiconductor layer, having the first conductivity type and disposed on the first silicon carbide semiconductor layer;

a third silicon carbide semiconductor layer, having a second conductivity type and disposed on an upper surface of the second silicon carbide semiconductor layer;

a first semiconductor region, having the first conductivity type and disposed in the third silicon carbide semiconductor layer;

a first trench, perpendicularly penetrating through the first semiconductor region and the third silicon carbide semiconductor layer into the second silicon carbide semiconductor layer and extending in a first horizontal direction;

a second trench, spaced apart from the first trench, the second trench perpendicularly penetrating through the third silicon carbide semiconductor layer into the second silicon carbide semiconductor layer and extending in the first horizontal direction;

a second semiconductor region, having the second conductivity type and comprising a plurality of first portions extending in a second horizontal direction and a second portion extending in the first horizontal direction and disposed in the second silicon carbide semiconductor layer under the first trench;

a gate region, comprising a gate insulating layer disposed in the first trench and a poly gate embedded in the first trench and formed on the gate insulating layer; and a metal electrode, in contact with the first semiconductor region and the gate region and embedded in the second trench to be in electrical contact with the second semiconductor region and the third silicon carbide semiconductor layer, wherein a side wall and a bottom wall of the metal electrode forms a Schottky junction with the second silicon carbide semiconductor layer in the second trench;

wherein the first portion of the second semiconductor region comprises a plurality of pickup regions and a plurality of slice regions, the plurality of pickup regions surrounds the first trench and is connected to the second portion, the plurality of slice regions surrounds the second trench and is connected to the pickup regions, and current flowing from the metal electrode is restricted between the plurality of slice regions which are adjacent.

2. The silicon carbide semiconductor device according to claim 1, wherein the second semiconductor region has an implantation depth which is ranged from an upper surface of the third silicon carbide semiconductor layer to the second silicon carbide semiconductor layer.

3. The silicon carbide semiconductor device according to claim 2, wherein the implantation depth is in a range between 0.8 μm and 3 μm.

4. The silicon carbide semiconductor device according to claim 1, wherein the plurality of first portions of the second semiconductor region is a plurality of segmental implant regions formed at intervals, the plurality of segmental implant regions are spaced apart from each other by a distance.

5. The silicon carbide semiconductor device according to claim 4, wherein the distance is in a range between 0.5 μm and 3 μm.

6. The silicon carbide semiconductor device according to claim 5, wherein the segmental implant region has a width in a range between 0.5 μm and 1.5 μm.

7. The silicon carbide semiconductor device according to claim 1, wherein the second silicon carbide semiconductor layer comprises an n-type drift layer and an n-type current spreading layer.

* * * * *